United States Patent
De Santis et al.

(10) Patent No.: US 6,894,934 B2
(45) Date of Patent: May 17, 2005

(54) NON-VOLATILE MEMORY CELL SENSING CIRCUIT, PARTICULARLY FOR LOW POWER SUPPLY VOLTAGES AND HIGH CAPACITIVE LOAD VALUES

(75) Inventors: Fabio De Santis, Milan (IT); Marco Pasotti, San Martino Siccomario (IT); Guido De Sandre, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/728,372

(22) Filed: Dec. 4, 2003

(65) Prior Publication Data

US 2004/0160837 A1 Aug. 19, 2004

(30) Foreign Application Priority Data

Dec. 4, 2002 (EP) .............................. 02425747

(51) Int. Cl.[7] .............................. G11C 7/00; G11C 16/06
(52) U.S. Cl. .............................. 365/189.07; 365/189.09; 365/185.2; 365/185.21
(58) Field of Search .................. 365/189.07, 189.09, 365/185.2, 185.21, 207, 208

(56) References Cited

U.S. PATENT DOCUMENTS

| 5,351,212 A | * | 9/1994 | Hashimoto | 365/185.21 |
|---|---|---|---|---|
| 5,699,295 A | * | 12/1997 | Yero | 365/185.21 |
| 5,729,490 A | * | 3/1998 | Calligaro et al. | 365/185.21 |
| 6,219,277 B1 | * | 4/2001 | Devin et al. | 365/185.21 |
| 6,219,290 B1 | * | 4/2001 | Chang et al. | 365/207 |
| 6,473,340 B1 | * | 10/2002 | Pasotti et al. | 365/185.21 |
| 6,711,080 B2 | * | 3/2004 | Kern et al. | 365/185.21 |
| 6,735,120 B2 | * | 5/2004 | Homma et al. | 365/185.21 |

FOREIGN PATENT DOCUMENTS

| DE | 10102180 | 5/2002 | ............ G11C/16/26 |
|---|---|---|---|
| WO | 90/12400 | 10/1990 | ............ G11C/7/00 |

* cited by examiner

*Primary Examiner*—Trong Phan
(74) *Attorney, Agent, or Firm*—Lisa K. Jorgenson; Allen, Dyer, Doppelt, Milbrath & Gilchrist, P.A.

(57) ABSTRACT

A sensing circuit for a memory cell includes a first bias current generator connected between a first voltage reference and a first inner circuit node, and a second reference current generator connected to the first voltage reference. A comparator having a first input terminal is connected to a comparison circuit node that is connected to the second reference current generator, a second input terminal is connected to a circuit node that is connected to the first inner circuit node, and an output terminal forms an output terminal of the sensing circuit. A cascode-configured bias circuit is connected between the inner circuit node and a matching circuit node. The cascode-configured bias circuit is also connected to a second voltage reference. A current/voltage conversion stage is connected to the matching circuit node, to the comparison circuit node, and to a third voltage reference.

21 Claims, 4 Drawing Sheets

NON-VOLATILE MEMORY CELL SENSING CIRCUIT, PARTICULARLY FOR LOW POWER SUPPLY VOLTAGES AND HIGH CAPACITIVE LOAD VALUES

FIELD OF THE INVENTION

The present invention relates to non-volatile memory cell sensing circuits, particularly for low power supply voltages and high capacitive loads. The present invention also relates particularly, but not exclusively, to a memory cell sensing circuit for FLASH-type non-volatile memory devices, and the following description is made with reference to this field of application for convenience of illustration only.

BACKGROUND OF THE INVENTION

The development of improved processes for manufacturing non-volatile memory cell devices in the CMOS technology field requires the use of lower and lower supply voltages, in some cases close to 1V. In particular, very low supply voltage values are necessary for the use of thinner and thinner oxides. Also, the improved processes should limit as much as possible power consumption in the so-called "design low power" field.

Nevertheless, there are some requirements that remained basically unchanged despite the evolution in technology which is in contrast with these requirements. On one hand, there is a need to bias memory cells with drain voltages that are almost constant when technology varies (equal to 1V) in order to keep the current passing through the memory cells in the reading step high. On the other hand, there is a need for low access times even with high capacitive loads due to the large memory cuts required. These two factors make it difficult to manufacture a sensing circuit that is capable of performing a correct bias and I/V conversion for a memory cell in a limited voltage range (Vx).

A known sensing circuit, with traditional memory cell bias, is schematically shown in FIG. 1 and is globally indicated by reference numeral 1. In particular, the sensing circuit 1 is connected to a non-volatile memory cell, illustrated by an equivalent current Ic generator 2 connected to a first voltage reference, such as ground GND.

Moreover, the sensing circuit 1 is connected to a second voltage reference, such as the supply Vdd, by way of a load 3. The following relation applies to the sensing circuit 1:

$$Vx = Vdd - VBL \quad (1)$$

where Vdd indicates the circuit supply value and VBL indicates the drain terminal bias voltage of the memory cell corresponding to a voltage value in the contact point between the cell 2 and the sensing circuit 1.

In known memory devices, particularly in flash memories, the voltage value Vx provided by the above-mentioned relation (1) can be equal, and by way of example, even to only 200 mV. The sensing circuit 1 is difficult to manufacture for a correct bias of the load 3.

Moreover, to compensate for the reduced drive-capability due to the low supply voltage, it is often necessary to use particular transistors, such as natural transistors. However, these transistors have a higher cost linked to the number of process masks used for their manufacture.

SUMMARY OF THE INVENTION

In view of the foregoing background, an object of the present invention is to provide a sensing circuit for non-volatile memory cells that operates at low supply voltages and for high capacitive loads, and has structural and functional characteristics for overcoming the limits and drawbacks still effecting prior art circuits.

This and other objects, advantages and features in accordance with the present invention are provided by a sensing circuit comprising a cascode-configured bias circuit and a high efficiency I/V converter. The sensing circuit may operate at supply voltages very close, but not exclusively, to the values which are typical of the bias voltages of the cells manufactured with improved processes.

In particular, the sensing circuit may comprise a first bias current generator connected between a first voltage reference and a first inner circuit node. At least one second reference current generator may be connected to the first reference voltage. A comparator may have a first input terminal connected to a comparison circuit node that is connected to the at least one second reference current generator, a second input terminal connected to a circuit node that is connected to the first inner circuit node, and at least one output terminal forming at least one output terminal of the sensing circuit.

A cascode-configured bias circuit may be connected between the inner circuit node and a matching circuit node. The cascode-configured bias circuit may also be connected to a second voltage reference. A current/voltage conversion stage may be connected to the matching circuit node, to the comparison circuit node, and to a third voltage reference. The cascode-configured bias circuit may comprise a first transistor connected between the inner circuit node and the matching circuit node, and an operational amplifier. The operational amplifier may have an output terminal connected to a control terminal of the first transistor, a first input terminal connected to the third voltage reference and a second input terminal connected to the output terminal. The first transistor may comprise a P-channel MOS transistor.

The current/voltage conversion stage may comprise a second transistor that is diode-configured and is connected between the matching circuit node and the third voltage reference. A third transistor may be connected between the comparison circuit node and the third voltage reference. The third transistor comprises a control terminal that may be connected to the control terminal of the second transistor. The second and third transistors may comprise N-channel MOS transistors.

Another aspect of the present invention is directed to a memory device comprising at least one memory cell, and a sensing circuit as defined above connected thereto.

Yet another aspect of the present invention is directed to a method of making a sensing circuit as described above.

BRIEF DESCRIPTION OF THE DRAWINGS

The features and advantages of the sensing circuit according to the present invention will be apparent from the following description of an embodiment thereof given by way of a non-limiting example with reference to the attached drawings. In the drawings.

DETAILED DESCRIPTION OF THE PREFERRED EMBODIMENTS

Figure 1:
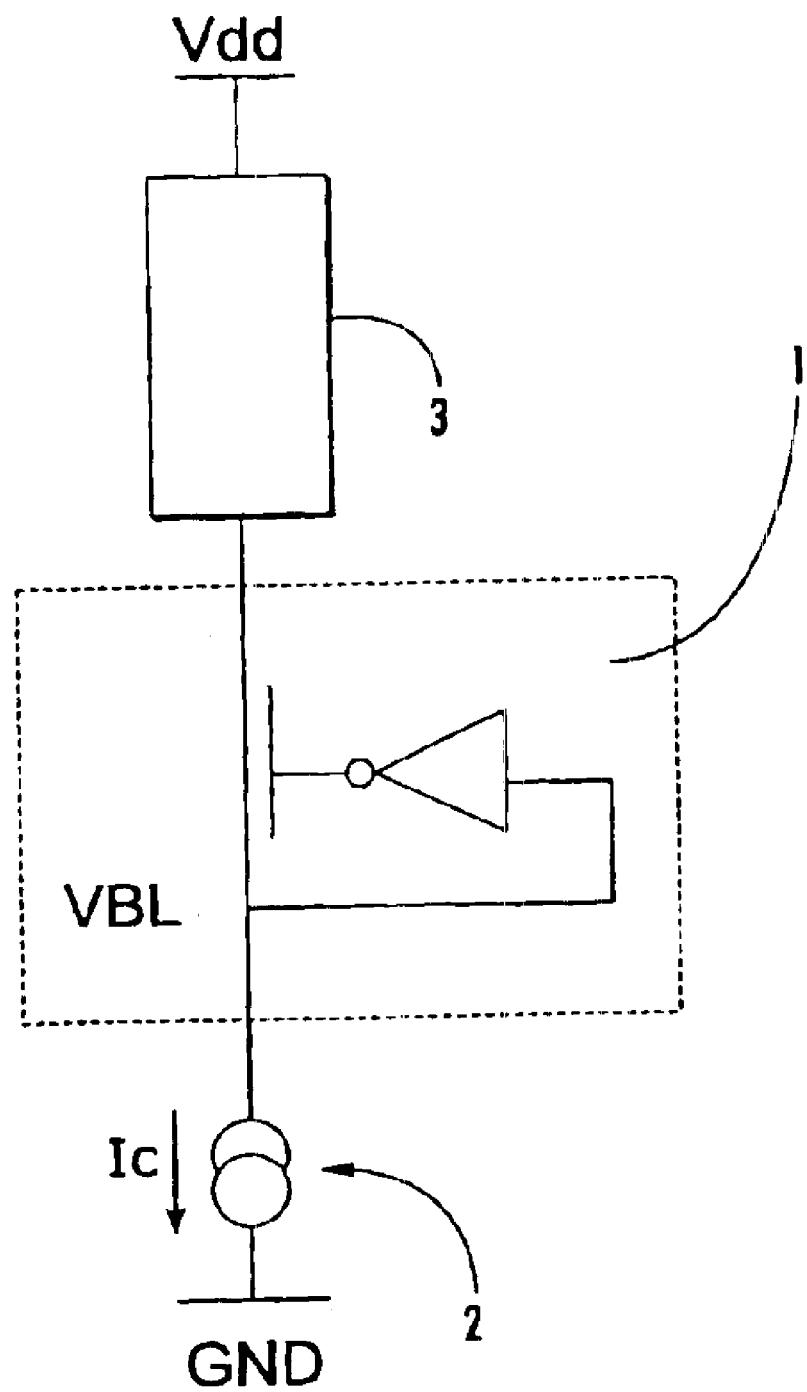
FIG. 1 schematically shows a sensing circuit according to the prior art.
Figure 2:
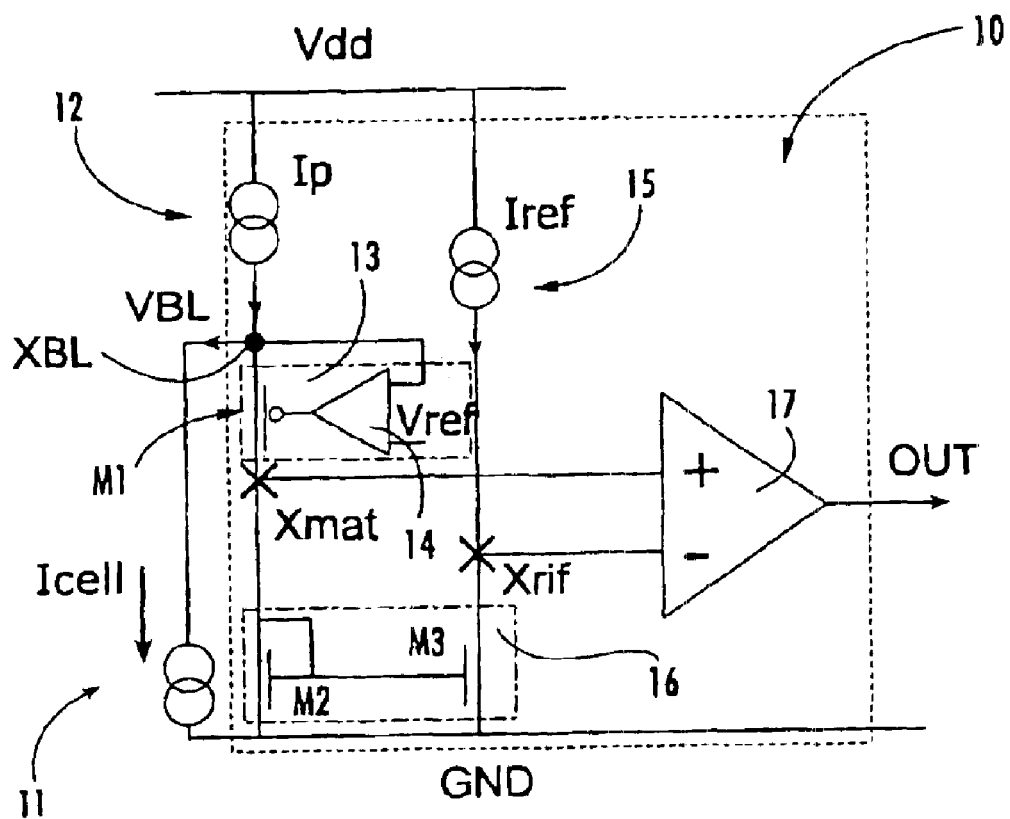
FIG. 2 schematically shows a sensing circuit according to the present invention.

With reference to the drawings, and particularly to FIG. 2, a sensing circuit according to the present invention is globally and schematically indicated by reference numeral 10. The sensing circuit 10 is inserted between a first voltage reference, such as a supply voltage Vdd, and a second voltage reference, such as ground GND. The sensing circuit 10 is connected to an inner circuit node or bitline XBL and to a memory cell 11. The memory cell is represented by a current generator Icell.

The sensing circuit 10 comprises a bias current Ip generator 12 inserted between the supply voltage reference Vdd and the bitline XBL. The bitline XBL is connected to a matching node Xmat by a cascode-configured bias circuit 13.

The cascode-configured bias circuit 13 receives as input a voltage reference Vref. The cascode-configured bias circuit 13 comprises a transistor M1, of the P-channel MOS type, inserted between the bitline XBL and the matching node Xmat. The transistor M1 has a gate terminal connected to an output terminal of an operational amplifier 14. The operational amplifier 14 has a first input terminal for receiving the reference voltage Vref, and a second input terminal connected to the bitline XBL.

A reference current Iref generator 15 is inserted between the supply voltage reference Vdd and a comparison node Xrif. The matching node Xmat and the comparison node Xrif are connected to ground GND by a current/voltage conversion (I/V) stage 16. The I/V conversion stage 16 comprises a first N-channel MOS transistor M2, which is diode-configured and is inserted between the matching node Xmat and ground GND, as well as a second N-channel MOS transistor M3, inserted between the comparison node Xrif and ground GND and having its gate terminal connected to the gate terminal of the first transistor M2.

The sensing circuit 10 also comprises a detecting circuit, such as a comparator 17, having the input terminals connected to the matching node Xmat and to the comparison node Xrif. An output terminal OUT of the comparator 17 corresponds to an output terminal of the sensing circuit 10.

On the basis of the schematic shown in FIG. 2, operation of the sensing circuit 10 according to the invention will now be described. The generator 12 supplies the current Ip for biasing the memory cell 11 connected to the bitline XBL during the reading phase, and also for biasing the conversion stage 16 through the transistor M1.

The difference between the bias current Ip of the generator 12 and the current Icell of the memory cell 11 with respect to a value of the reference current Iref of the generator 15 causes, due to the conversion stage 16 gain, a dynamic change in a value of the voltage Vrif on the comparison node Xrif.

In particular, the voltage Vrif is compared by the comparator 17 with a voltage Vmat on the matching node Xmat. This depends on a value of the voltage of the memory cell 11 being read that is connected to the bitline XBL.

In the meantime, the cascode-configured bias circuit 13 performs a fixed bias of the bitline XBL even when the impedance of the memory cell 11 varies. This variation is due to the unknown state of the memory cell 11 being read (a virgin or programmed cell). Therefore, the I/V conversion stage 16 does not disturb the memory cell itself.

Figure 3A:
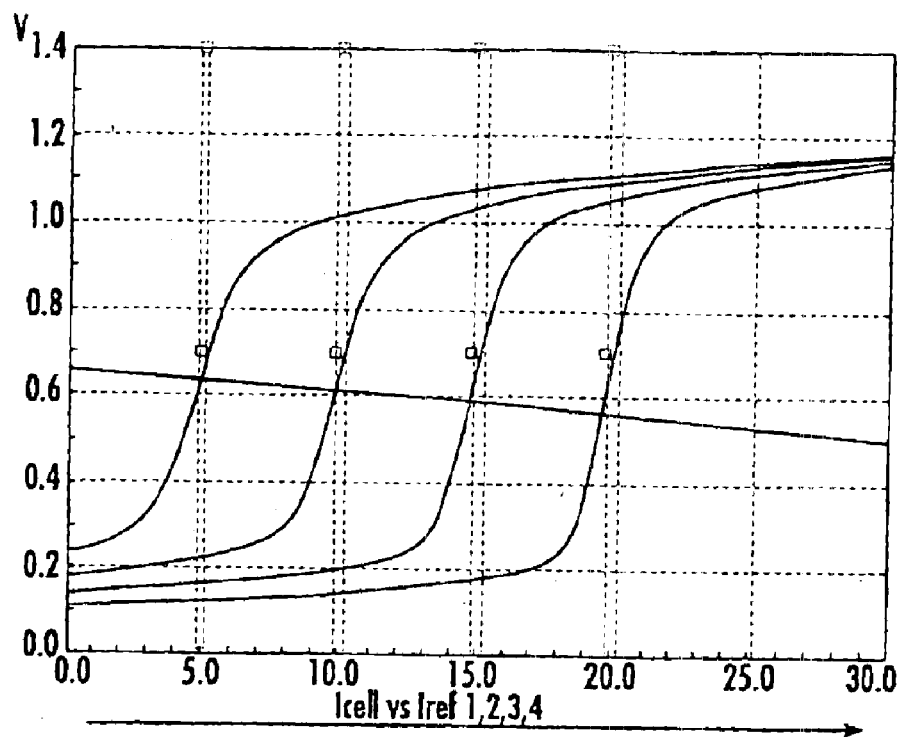
FIGS. 3A and 3B schematically show the time trend of voltage values in inner nodes of the sensing circuit of FIG. 2.

FIG. 3A shows the trend of the output feature of the sensing circuit 10 according to the invention, i.e., the trend of the voltage Vrif on the comparison node Xrif with respect to the current Icell flowing in the memory cell 11 by using a supply voltage equal to 1.1V and a bias voltage of the bitline XBL equal to 800 mV, as obtained from simulations.

Figure 3B:
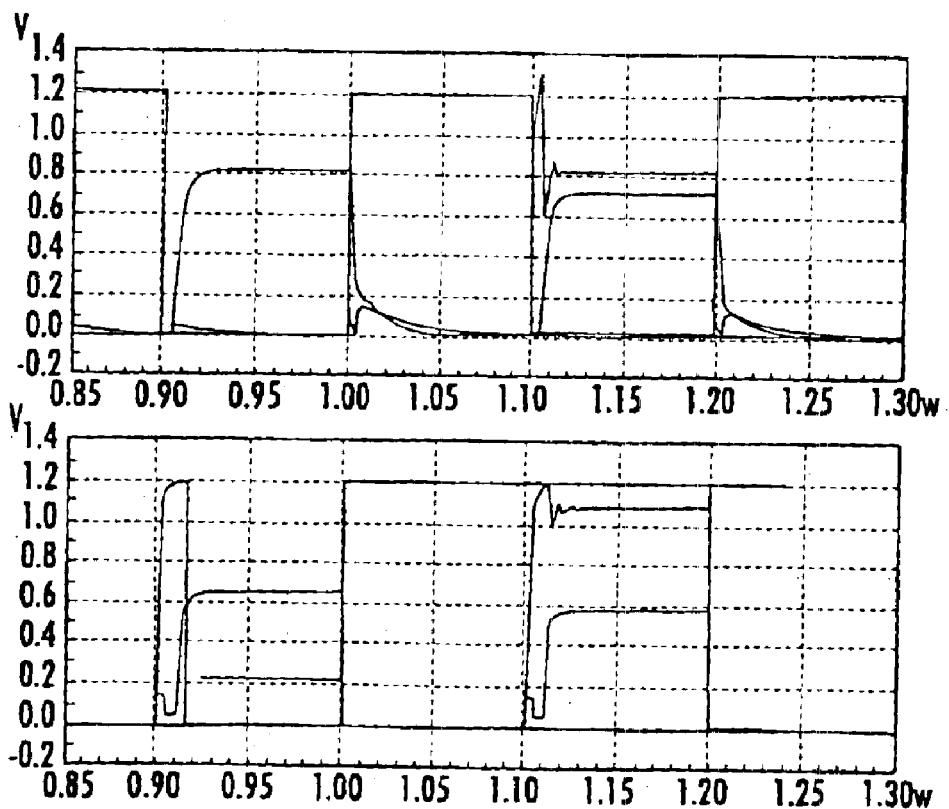

Similarly, FIG. 3B shows the time trend of the voltage values Vmat and Vrif on the matching node Xmat and on the comparison node Xrif, respectively, when the reference current Irif supplied by the generator 15 varies, and of the dynamic feature of the comparator 17 for programmed or virgin memory cells (output indicated in FIG. 3B with DATA1[0]).

On the basis of the results of these simulations (as shown in FIG. 3A), the gain of the sensing circuit is high, particularly when the voltages to be compared are close to each other. This is based upon the sensing circuit comprising the generator 12, the cascode-configured bias circuit 13, the generator 15 and the I/V conversion stage 16 (except for the comparator 17).

The bias voltage VBL of the bitline XBL is not lost in the bias dynamics of the sensing circuit 10, as in prior art circuits. In fact, the bias voltage VBL of the bitline XBL is advantageously exploited as dynamics for the conversion stage 16 and for the cascode-configured bias circuit 13.

The use of the cascode-configured bias circuit 13 inserted between the bias part of the bitline XBL (generator 12) and the conversion part (stage 16) makes the sensing circuit 10 according to the invention free with respect to the so-called drain disturb phenomenon, and makes reading operations performed on the cell 11 more reliable.

Figure 4:
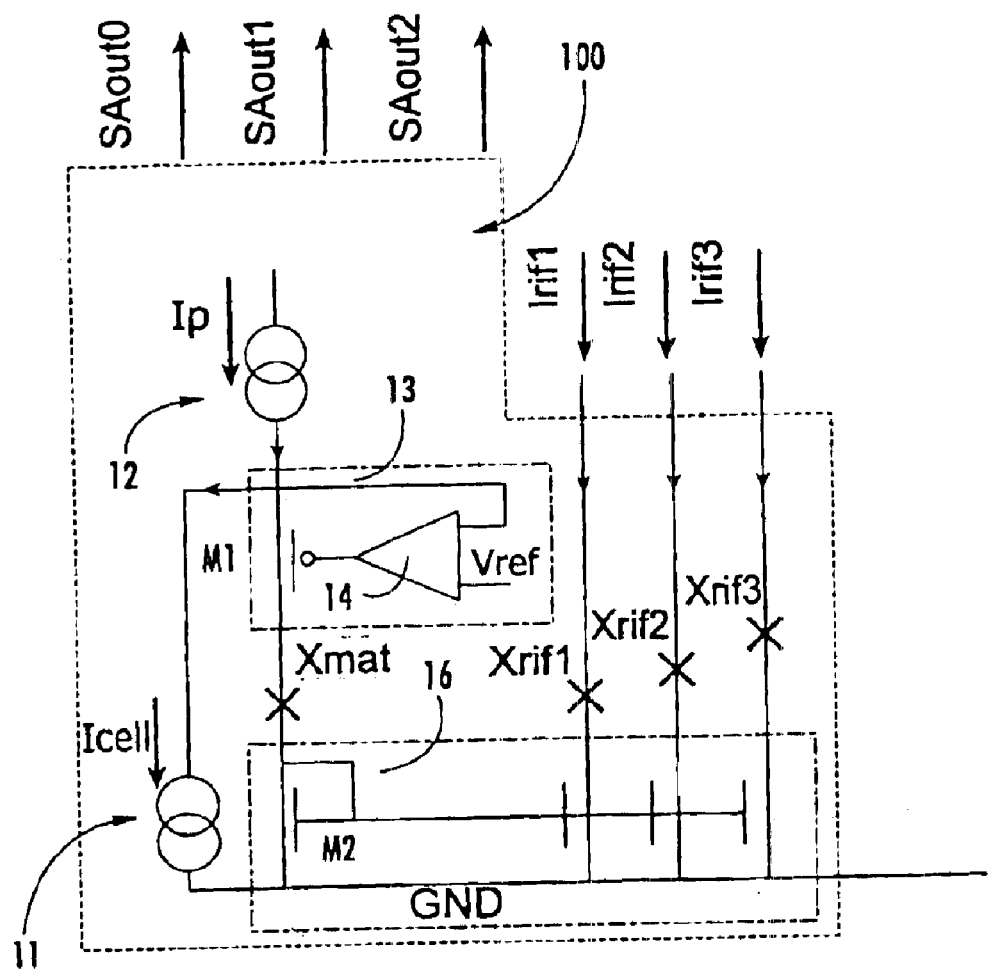
FIG. 4 schematically shows an alternative embodiment of the sensing circuit according to the present invention applied to general multilevel memories.

It is also possible to extend the operating principle of the sensing circuit 10 according to the invention to a multilevel application, as schematically shown in FIG. 4. FIG. 4 shows a sensing circuit 100 used in a two-bit per cell application for convenience of illustration. The principle according to the invention may be further extended to n bits per cell.

The sensing circuit 100 comprises a plurality of branches with a plurality of reference currents Irif1, Irif2, Irif3 connected to a plurality of inputs Xrif1, Xrif2, Xrif3 of an output comparator (not shown). The output comparator also has a further input terminal connected to the matching node Xmat, and a plurality of output terminals Saout0, Saout1, Saout2.

In conclusion, the sensing circuit according to the invention allows the difficulties of known circuits to be overcome, by not requiring particular components and completely exploiting the supply voltage Vdd provided. In fact, the sensing circuit according to the invention does not limit the use of the circuitry thereof due to the fixed bias level of the bitline XBL. The sensing circuit allows a correct bias of the memory cell to be performed, and the reading voltage to be set, which is, as it is well known, a critical aspect to avoid the reading drain disturb phenomena.

The voltage level required to bias the memory device bitlines does not directly effect the definition of the residual voltage used for the I/V conversion and for the stable definition of the bitline level, but is exploited in parallel to this. The choice of drawing the cell current in parallel instead of serially, as in circuits according to the prior art, defines a fixed value that cannot be used for the sensing circuit. In parallel it takes advantage of exploiting all the bitline bias levels, now close to the supply value, to perform both the I/V conversion and the cascode operation required to set the bitline voltage and the capacitive decoupling.

That which is claimed is:
1. A sensing circuit for a memory cell and comprising:
   a first bias current generator connected between a first voltage reference and a first inner circuit node;

at least one second reference current generator connected to the first voltage reference;

a comparator having a first input terminal connected to a comparison circuit node that is connected to said at least one second reference current generator, a second input terminal connected to a circuit node that is connected to the first inner circuit node, and at least one output terminal forming at least one output terminal of the sensing circuit;

a cascode-configured bias circuit connected between the inner circuit node and a matching circuit node, said cascode-configured bias circuit also connected to a second voltage reference; and a current/voltage conversion stage connected to the matching circuit node, to the comparison circuit node, and to a third voltage reference.

2. A sensing circuit according to claim 1, wherein the first voltage reference is a supply voltage, and a third voltage reference is ground.

3. A sensing circuit according to claim 1, wherein said cascode-configured bias circuit comprises:

a first transistor connected between the inner circuit node and the matching circuit node, said first transistor comprising a control terminal; and an operational amplifier having an output terminal connected to the control terminal of said first transistor, a first input terminal connected to the second voltage reference and a second input terminal connected to the output terminal.

4. A sensing circuit according to claim 3, wherein said first transistor comprises a P-channel MOS transistor.

5. A sensing circuit according to claim 1, wherein said current/voltage conversion stage comprises:

a second transistor that is diode-configured and is connected between the matching circuit node and the third voltage reference, said second transistor comprising a control terminal; and a third transistor connected between the comparison circuit node and the third voltage reference, said third transistor comprising a control terminal connected to the control terminal of said second transistor.

6. A sensing circuit according to claim 5, wherein said second transistor and said third transistor comprise N-channel MOS transistors.

7. A sensing circuit according to claim 1, wherein said at least one second reference current generator comprises a plurality of reference current generators forming a plurality of branches connected to a plurality of inputs of said comparator; and wherein said at least one output terminal of said comparator comprises a plurality of output terminals for forming a plurality of output terminals of the sensing circuit.

8. A memory comprising:

at least one memory cell; and at least one sensing circuit connected to said at least one memory cell and comprising a first bias current generator connected to a first voltage reference, at least one second reference current generator connected to the first voltage reference, a comparator having a first input terminal connected to a comparison circuit node that is connected to said at least one second reference current generator, a second input terminal connected to a circuit node that is connected to said first bias current generator, and at least one output terminal forming at least one output terminal of the sensing circuit, a bias circuit connected to said first bias current generator, and a current/voltage conversion stage connected to said bias circuit, to the comparison circuit node, and to a second voltage reference.

9. A memory according to claim 8, wherein the first voltage reference is a supply voltage, and the second voltage reference is ground.

10. A memory according to claim 8, wherein said bias circuit comprises:

a first transistor connected between said first bias current generator and said current/voltage conversion stage, said first transistor comprising a control terminal; and an operational amplifier having an output terminal connected to the control terminal of said first transistor, a first input terminal connected to a third voltage reference and a second input terminal connected to the output terminal.

11. A memory according to claim 10, wherein said first transistor comprises a P-channel MOS transistor.

12. A memory according to claim 8, wherein said current/voltage conversion stage comprises:

a second transistor that is diode-configured and is connected between said bias circuit and the second voltage reference, said second transistor comprising a control terminal; and a third transistor connected between the comparison circuit node and the second voltage reference, said third transistor comprising a control terminal connected to the control terminal of said second transistor.

13. A memory according to claim 12, wherein said second transistor and said third transistor comprise N-channel MOS transistors.

14. A memory according to claim 8, wherein said at least one second reference current generator comprises a plurality of reference current generators forming a plurality of branches connected to a plurality of inputs of said comparator; and wherein said at least one output terminal of said comparator comprises a plurality of output terminals for forming a plurality of output terminals of said sensing circuit.

15. A method for forming a sensing circuit for a memory cell, the method comprising:

connecting a first bias current generator between a first voltage reference and a first inner circuit node;

connecting at least one second reference current generator to the first reference voltage;

connecting a comparator having a first input terminal to a comparison circuit node that is connected to the at least one second reference current generator, a second input terminal connected to a circuit node that is connected to the first inner circuit node, and at least one output terminal forming at least one output terminal of the sensing circuit;

connecting a bias circuit between the inner circuit node and a matching circuit node, the bias circuit also being connected to a second voltage reference; and connecting a current/voltage conversion stage to the matching circuit node, to the comparison circuit node, and to a third voltage reference.

16. A method according to claim 15, wherein the first voltage reference is a supply voltage, and the third voltage reference is ground.

17. A method according to claim 15, wherein the bias circuit comprises:

a first transistor connected between the inner circuit node and the matching circuit node, the first transistor comprising a control terminal; and an operational amplifier having an output terminal connected to a control terminal of the first transistor, a first input terminal connected to the third voltage reference and a second input terminal connected to the output terminal.

18. A method according to claim 17, wherein the first transistor comprises a P-channel MOS transistor.

19. A method according to claim 15, wherein the current/voltage conversion stage comprises:
  a second transistor that is diode-configured and is connected between the matching circuit node and the third voltage reference, the second transistor comprising a control terminal; and
  a third transistor connected between the comparison circuit node and the third voltage reference, the third transistor comprising a control terminal connected to the control terminal of the second transistor.

20. A method according to claim 19, wherein the second transistor and the third transistor comprise N-channel MOS transistors.

21. A method according to claim 15, wherein the at least one second reference current generator comprises a plurality of reference current generators forming a plurality of branches connected to a plurality of inputs of the comparator; and wherein the at least one output terminal of the comparator comprises a plurality of output terminals for forming a plurality of output terminals of the sensing circuit.

* * * * *